United States Patent
Gessner et al.

(10) Patent No.: US 6,975,442 B2
(45) Date of Patent: Dec. 13, 2005

(54) RESONANCE SCANNER

(75) Inventors: Thomas Gessner, Chemnitz (DE); Wolfram Doetzel, Chemnitz (DE); Christian Kaufmann, Burgstaedt (DE); Jan Mehner, Neukirchen (DE); Ramon Hahn, Chemnitz (DE); Steffen Kurt, Thalheim (DE)

(73) Assignee: Jenoptik Ldt GmbH, Gera (DE)

( * ) Notice: Subject to any disclaimer, the term of this patent is extended or adjusted under 35 U.S.C. 154(b) by 146 days.

(21) Appl. No.: 10/474,410

(22) PCT Filed: Apr. 12, 2002

(86) PCT No.: PCT/EP02/04118

§ 371 (c)(1),
(2), (4) Date: Oct. 9, 2003

(87) PCT Pub. No.: WO02/099504

PCT Pub. Date: Dec. 12, 2002

(65) Prior Publication Data

US 2004/0130765 A1 Jul. 8, 2004

(30) Foreign Application Priority Data

Apr. 12, 2001 (DE) ................................ 101 19 073

(51) Int. Cl.[7] .......................................... G02B 26/08
(52) U.S. Cl. ..................... 359/224; 359/199
(58) Field of Search ............................... 359/198, 199, 359/223, 224, 290–292, 298; 310/309, 36, 310/40 R, 40 MM

(56) References Cited

U.S. PATENT DOCUMENTS 5,543,956 A 8/1996 Nakagawa et al.
5,629,790 A 5/1997 Neukermans et al.
6,449,079 B1 9/2002 Herrmann

FOREIGN PATENT DOCUMENTS

DE 42 11 898 C2 10/1993
DE 43 34 267 A1 10/1993

(Continued)

Primary Examiner—James Phan
(74) Attorney, Agent, or Firm—Patterson, Thuente, Skaar & Christensen, P.A.

(57) ABSTRACT

A resonance scanner, wherein a frame (3), a drive plate (4), a mirror (5) and torsion springs (6, 7) form an actuator part (1), said drive plate (4) being attached within the frame (3) by two first torsion springs (6) such that the drive plate (4) can oscillate about a common first axis of torsion (8) of both torsion springs (6), said mirror (5) being attached within the drive plate (4) by two second torsion springs (7) such that the mirror (5) can oscillate about a common second axis of torsion (9) of both torsion springs (7), and said first axis of torsion (8) and said second axis of torsion (9) being parallel to each other; wherein, further, only the frame (3) of the actuator part (1) is attached to side walls (10) of a box-shaped stator part (2), a drive means (stator electrodes 15 or coil 24) is arranged at a bottom (11) of the stator part (2) only in the region of the geometrical surface area of the drive plate (4) and said bottom (11) has a recess (13) in the region of the geometrical surface area of the mirror (5), which recess (13) is dimensioned at least such that a maximum mechanical deflection of the mirror (5) is not limited by the bottom (11), said drive means (stator electrodes 15 or coil 24) applying a force only directly to the drive plate (4) and said force following a periodic function, whose period is tuned to the eigenfrequency of the mirror (5), which differs from the eigenfrequency of the drive plate (4).

23 Claims, 7 Drawing Sheets

FOREIGN PATENT DOCUMENTS

| | | |
|---|---|---|
| DE | 197 28 598 C2 | 2/1999 |
| DE | 198 57 946 C1 | 1/2000 |
| DE | 198 51 967 A1 | 5/2000 |
| EP | 0 774 681 A1 | 5/1997 |
| JP | 7-92409 | 4/1995 |
| WO | WO 98/44571 | 10/1998 |

RESONANCE SCANNER

The invention relates to a resonance scanner, wherein an actuator part comprises fixing elements for connection with a stator part, a drive plate, a mirror, and torsion springs, said drive plate being attached to the fixing elements via two first torsion springs such that it can oscillate about a common first axis of torsion of the first torsion springs and has a first eigenfrequency, said mirror being attached within and to the drive plate via two second torsion springs such that said mirror can oscillate about a common second axis of torsion of the second torsion springs and has a second eigenfrequency which differs from the first eigenfrequency, said first axis of torsion and said second axis of torsion being parallel to each other, and wherein a drive means is arranged at the stator part in the region of the extent of the drive plate, by means of which drive means force is directly applicable to the drive plate, wherein the drive means is controllable such that said force follows a periodic function, whose period is tuned to the second eigenfrequency. The invention further relates to a method of manufacturing such resonance scanner.

The basic principles of electromechanical beam deflection systems are illustrated in Stan Reich, "The use of electromechanical mirror scanning devices", SPIE Vol. 84, Laser Scanning Components & Techniques (1976), FIG. 1. In its right-hand part, said FIGURE shows a group of scanners to which the invention relates, i.e. the so-called resonance scanners. In resonance scanners, the mirror surface is driven electromagnetically, electrostatically or piezoelectrically, depending on the size of the mirror and the required dynamics.

Use is often made of electrostatic drives. The advantages of this principle are that no additional materials, for example, metallic conductors or magnets (as in electrodynamic drives) or piezoelectric materials (as in piezoelectric drives), need to be used on the mirror, said materials having a negative effect on the magnitude of the attainable resonance frequency, on the scanning speed and sometimes on the smoothness of the light-reflecting surface.

However, in order to obtain high field strengths, electrostatic drives require an electric field space which is formed between the mirror and electrodes being arranged at a short distance. Electrodes are usually constructed to be stationary, to have a large surface area and to be parallel to the idle position of the mirror. The advantage of this arrangement is that the drive torque is not reduced even when the mirror is deflected and that the scanner can be particularly efficiently driven up to maximum deflection. Due to the required short distance within a range of up to ca. 500 $\mu$m, the angle of deflection of such scanners is essentially limited by a mechanical stop thus formed and by instabilities of the electrostatic drive (pull-in effect).

The literature describes solutions which partially overcome this problem. In K. Reimer, H. J, Quenzer, M. Juerss, B. Wagner, "Micro-optic fabrication using one-level graytone lithography", Miniaturized Systems with Micro-Optics and Micromechanics II, Proc. SPIE 3008, pp. 279–288, 1997, electrodes inclined toward the mirror are used, which electrodes are distanced further apart at the periphery of the mirror and thus allow greater deflection. However, due to the smaller field strength in the peripheral region, a higher driving voltage is required. Further constructions are described in H. Schenk, P. Duerr, H. Kueck, "A novel electrostatically driven torsional actuator", Proc. of MOEMS '99 Conference, Mainz, Germany, and in R. A. Conant, J. T. Nee, K. Y. Lau, R. S. Muller, "A flat high-frequency scanning micromirror", IEEE Solid State Sensor and Actuator Workshop, Hilton Head, June 2000, pp. 6–9, wherein, instead of a large-scale electrode, specially designed comb-shaped electrodes at the periphery of the mirror or at additionally attached drive webs excite oscillation of the mirror by means of an electrostatic stray field.

In these solutions, the above-mentioned effects do not limit the maximum possible angle of deflection. However, due to the use of the stray field, the electrostatically generated torque has a particularly strong effect in only a part of the oscillatory movement and the drive works less efficiently during the remaining cycle of movement.

DE 197 285 98 C2 proposes a device improved in this respect, wherein a double torsional pendulum is provided with a driving member in the form of a first torsional oscillator and a second torsional oscillator being coupled therewith and bearing a mirror surface. Driving the first torsional oscillator at a frequency which corresponds to the resonance frequency of the coupled second torsional oscillator results in a resonance magnification at the second torsional oscillator, and thus, in a high amplitude.

A similar double torsional pendulum structure is disclosed in DE 433 426 7 A1, wherein the first torsional oscillator is a frame-shaped drive plate, in which a mirror surface is rotatably suspended as second, coupled torsional oscillator. The frame-shaped drive plate is mounted on a base support via plate-shaped fixing elements.

Buser R., "Theoretical and Experimental Investigations on Silicon Single Crystal Resonant Structures", Thesis, University of Neuchatel, Switzerland, 1989, pages 165–179, as well as Buser R. and Rooij N., "Very High Q-Factor Resonators in Monocrystalline Silicon Sensors and Actuators, A21–A23, 1990, pp. 323–327, describe various structures provided as torsional oscillators. Therein, double torsional pendulums are used as sensors (e.g. pressure sensors), with an internal oscillator being supported on a frame with the help of torsion springs, said frame in turn being supported, with the help of torsional springs, on a clamping device surrounding the frame. The internal oscillator and the frame are arranged a short distance above a glass plate. The stator electrodes applied on the glass plate cover most of the surface area of the internal oscillator. Only the area adjacent the torsion springs does not include an electrode coating. For the intended sensor application, a variation of amplitude of the internal oscillator is evaluated.

The object underlying the invention is to provide a resonance scanner which has a simple structure and is easily controllable. Thus, the oscillating mirror surface should enable a wide angle of deflection for a large reflecting surface also at a high deflection frequency.

According to the invention, this object is achieved in a resonance scanner of the above-mentioned type in that the stator part has a box-shaped design with circumferential side walls and a bottom, the fixing elements are provided as a frame which is attached to the side walls of the stator part, the drive means are located at the bottom of the stator part and the bottom has a recess in the region of the mirror, which recess reduces damping of the mirror and which is dimensioned at least such that a maximum mechanical deflection of the mirror is not limited by the bottom.

Said object is further achieved by a method of manufacturing such resonance scanner, wherein a plurality of actuator parts are structured and conditioned on an actuator wafer and a plurality of stator parts are structured and conditioned on a stator wafer, with one side of a structured actuator wafer being connected with a structured stator wafer or with both sides of an actuator wafer being connected with two stator wafers by means of a micromechanical joining method, and this compound being separated into a plurality of resonance scanners by separating cuts.

The oscillatory system of mirror and drive plate is dimensioned such that, for a periodic function of the action of force at a operating frequency, said system has a substantial and usable amplification of an amplitude of the mirror with respect to an amplitude of the drive plate.

The operating frequency $f_A$ is constant for an amplitude modulation of the action of force and is near the resonance frequency $f_R$ of the oscillatory mechanical system of the mirror. It is favourable for the closed-loop control characteristics of the mirror if the operating frequency $f_A$ does not correspond exactly to the resonance frequency $f_R$ of the mirror. When the mechanical oscillating mirror is strongly damped, the operating frequency $f_A$ is nearer to the resonance frequency $f_R$, and further distanced therefrom when there is weak damping. For a frequency modulation of the action of force within a range $\Delta f_A$, the amplitude of the action of force is kept constant.

If the operating frequency corresponds exactly to the resonance frequency of the mirror, the greatest amplitude of oscillation of the mirror is achieved. If the operating frequency is only near the resonance frequency, the amplitude is correspondingly smaller. The modulation method and a suitably selected operating frequency generate a desired phase angle of the scanning movement and a desired amplitude, depending on the existing constructional dimensions.

The resonance scanner according to the invention consists of two coupled torsional oscillators, wherein the drive plate and its directly engaging first torsion springs form an external resonator and the mirror and its directly engaging second torsion springs form an internal resonator.

This coupled oscillator system comprises two identical degrees of rotational freedom which are important to its function. At the same time, there exist two eigenfrequencies and the associated eigenoscillations. For a desired great deflection of the scanner, that oscillation whose eigenvectors have a high amplitude ratio of the internal oscillator, i.e. the mirror, relative to the external oscillator, i.e. the drive plate, is excited at its resonance frequency. Said excitation occurs only on the external oscillator, i.e. the drive plate. The drive plate has a comparatively large surface area. Thus, on the one hand, greater actions of force are achieved and, on the other hand, their damping is greater.

Separating the oscillatory system into the drive plate and the mirror, allows the arrangement of each of these components within its environment to be optimized. The recess in the stator part in the region of the mirror enables its great amplitude of oscillation and reduces its damping.

Since the exact position of the mirror, i.e. of the internal oscillator, is a decisive factor for the optical quality of a resonance scanner, the entire structure should be designed to be as rigid as possible in terms of warping. In the resonance scanner according to the invention, this is achieved by providing the stator part with a box-shaped design having circumferential side walls and a bottom. Such box-shaped structure exhibits high structural strength and particularly little tendency to warping at the oscillations appearing during operation.

In order to obtain a resonance scanner which is as strong and as rigid as possible, shows as little warping as possible even during operation of the internal oscillator near or at the resonance frequency and thus ensures good optical quality, it is further envisaged to attach a frame to the circumferential side walls of the box-shaped stator part, at which frame the torsion springs are suspended with the drive plate. By means of the frame which is attached to circumferential side walls of a stator part, a high-strength resonance scanner is achieved which does not show any undesired warping even at high operating frequencies, so that the oscillation of the internal oscillator is very exactly predictable and thus controllable. This ensures high optical quality of the scanner, as required, for example, in projection applications. The box-shaped stator part in combination with the frame attached thereto allows to apply great drive forces without a deformation of the stator or the actuator occurring via the torsional oscillation to be excited. In addition, the frame from which the torsion springs are suspended with the drive plate ensures that the internal tension of the material, in particular in the region of the torsion springs, remains unchanged at all times, i.e. also during assembly.

The possible small distance of the drive plate from the stator part allows the drive to be optimized with the objective of transmitting great forces and generating small angular movements, which are translated into a great deflection of the mirror by said mechanical coupling, up to an order of magnitude of +/−10°.

In order to generate the drive forces, a drive means interacts with the drive plate, or the drive plate itself contains parts of the drive means. Preferably, movement of the drive plate is excited by means of electrostatic and/or electromagnetic forces. Therefore, an embodiment is preferred, wherein the drive means generates electrostatic and/or electromagnetic forces, wherein components of the drive means securely arranged on the stator part cooperate with components of the drive means arranged on a surface of the drive plate facing the bottom, or cooperate with the drive plate itself. However, the invention is not limited to these drive concepts. Rather, further suitable drive concepts and alternatives are well-known from the literature.

The forces acting on the drive plate are generated, for example, by electrostatic, electromagnetic, pneumatic or piezoelectric means. An essential advantage of the resonance scanner according to the invention is that both sides of the drive plate are provided with surfaces upon which drive forces may act or at which drive forces may be generated. Thus, one drive system, or two drive systems, may simultaneously act on the drive plate. For this purpose, in one embodiment, stator parts are attached opposite each other, one on each side of the frame of the actuator part.

An electrostatic drive is particularly advantageous because it can be realized with relatively little expenditure and is inexpensively controllable. In an electrostatic drive, the resonance scanner is realized without any problem with large-scale electrodes arranged opposite each other. An oscillating surface of the drive plate assumes the function of an electrode, and arranged opposite said surface, there are further electrodes, which are connected with the stator part.

The drive plate represents a movable electrode; an oppositely arranged electrode is securely located in the bottom of the stator part. Via the second torsion springs, the drive plate indirectly causes the mirror to oscillate at or near its eigenfrequency.

No electrostatic field effect is required at the mirror itself. Such effect is even absolutely undesired so that, conveniently, only one counter electrode is applied on the drive plate or if only the drive plate acts as a counter electrode. This advantageously allows selecting the distance between the mirror and the surrounding stator part as the housing such that a comparatively great angular deflection of the mirror can be realized, with the magnitude of said deflection not being limited by a mechanical stop.

Additionally, the larger free spaces possible between the housing parts and the mirror lead to considerably lower damping of the mirror by the surrounding air, which has immediate effects on the extent of the achievable resonance magnification. By said reduction in air damping, at the same time, a greater mechanical quality factor and, thus, greater deflections are achieved.

In the region of the drive plate, the two, comparatively large-scale electrodes, which are arranged parallel to each other, are arranged spaced at a particularly small distance (e.g. 30 $\mu$m). Due to the resonance frequency of the mirror/spring system, the drive plate will experience a substantially smaller deflection relative to the mirror, which enables minimization of the electrode gap and, consequently, a proportionally reduced drive voltage requirement.

The structure of the resonance scanner is particularly simplified, if the actuator part, consisting of the frame, the drive plate, the mirror and the torsion springs, is integrally manufactured from a torsion-resistant spring material. In the case of a steel material, the actuator part is conveniently manufactured by laser cutting. Monocrystalline silicon is particularly suitable, for which lithographic methods are preferably employed for structuring.

Monocrystalline silicon is characterized in that it does not show any signs of fatigue upon torsional stress and that highly developed mass production technologies are available. However, the invention is not limited to the use of such material. Rather, special types of sheet steel, special glasses or ceramics, for example, are also suitable.

The mirror preferably comprises a material possessing a desirable high reflective power for the wavelength to be reflected. For this purpose, it is advantageous if an optical surface of the mirror is coated with a reflecting layer or with a reflecting layer stack.

In a double acting drive system, there is one electrode system arranged below the drive plate and one electrode system arranged above the drive plate. By push-pull control, either the height of the drive voltage is further reduced, or the drive force is correspondingly increased.

The spatial separation of mirror and drive also has the advantage of providing bilateral optical access to the oppositely arranged mirror surfaces. The drive means are arranged so far outside the mirror that there are practically no restrictions as to the optical beam path.

In this connection, an advantageous embodiment of the resonance scanner consists in that two optical surfaces of the mirror, e.g. a first reflecting surface and a second reflecting surface, each of which reflects at least at one wavelength of the electromagnetic spectrum, are arranged in parallel opposite each other. Such design of the mirror allows the first surface to be provided for reflection of a useful beam and the second surface to be provided for reflection of a measuring beam.

Thus, a useful beam may be deflected at one of said mirror surfaces and the position of the mirror may be optically detected by means of the opposite rear mirror surface. The position of the mirror may also be measured by means of a capacity measurement at the drive plate, because a feedback of the oscillating mirror to the drive plate is evaluable.

The invention is also applicable for those cases where the component referred to as mirror is transparent for wavelengths of the electromagnetic spectrum. In such case, the mirror has the effect of an oscillating plane parallel plate or of an oscillating lens, for example, also providing beam deflection.

A further embodiment of the component referred to as mirror consists in that the first surface and/or the second surface of the mirror is/are curved and thus has/have a beam-forming effect.

A further advantageous embodiment consists in that the recess of the stator part in the region of the mirror is provided such that the stator part has a continuous opening in this region. This measure makes the rear mirror surface accessible for beam deflection virtually without any limitations. If light having a wavelength for which the mirror is transparent is incident on the mirror, the optical aperture is not limited by the stator part. The mechanical damping of the oscillating mirror is additionally reduced by the free opening.

If the actuator part is surrounded by one stator part each on both sides thereof, it is convenient to provide both stator parts with an opening.

The resonance scanner is further characterized by a method of manufacturing it, wherein a plurality of actuator parts is structured and conditioned on an actuator wafer, preferably of monocrystalline silicon, and a plurality of stator parts is structured and conditioned on a stator wafer, preferably of monocrystalline silicon.

A structured actuator wafer is joined with a structured stator wafer by means of a micromechanical joining method. Such methods are, for example, gluing, soldering, glass joining or wafer bonding, in particular low-temperature silicon direct bonding, anodic or eutectic bonding. The compound is separated into resonance scanners by separating cuts.

If two stator parts are arranged on one actuator part, a structured actuator wafer is connected on both of its two structured surfaces with one stator wafer each.

The actuator wafer and the stator wafer may be formed from the wafer material particularly inexpensively by a combination of wet and dry etching steps.

Structuring the wafer material and equipping it with electrodes, electrical conductors, sensors as well as control and measurement electronics, can be done by methods known from electronics engineering. The technologies available allow inexpensive mass production to be realized.

The resonance scanners can typically be manufactured to have a resonance frequency above 20 kHz at a mirror diameter ranging from 0.5 to 5 mm for mechanical angles of deflection ranging from +/−1° to +/−10°.

At an operating frequency of 24 kHz, for example, for a mirror diameter of 2 mm, a mechanical angle of deflection of +/−6° is obtained.

In order to achieve high drive frequencies, it may be desirable, depending on the design of the drive means, to keep the capacity of the drive means as low as possible. In such case, interferences caused by parasitic capacities produced between a drive means arranged at the bottom of the stator part and conductive components of the stator part itself are disturbing. Such parasitic capacities occur, for example, when an electrode is mounted on a non-insulating silicon wafer which is provided with an insulating layer. The electric capacity produced between the stator electrode and the silicon basic body may be even greater than the electric capacity between the electrode and the drive plate. Control is then extremely difficult; the electric voltage of a voltage source required for driving the resonance scanner is then relatively high.

For this reason, it is preferable to produce the stator part from a basic material having high electric resistance, since parasitic capacities are then low, in particular lower than the capacity between a stator electrode and the drive plate.

Therefore, the stator part conveniently comprises a basic body of an electrically insulating material, in particular glass, ceramics or quartz. Using such basic body, the electric capacity, in particular in an electrostatic drive, is essentially determined by the drive plate and by the drive means arranged at the bottom.

The oscillations of the drive plate, and thus the position of the mirror, may then be detected by capacitative methods, without requiring additional sensors. In the case of parasitic capacities which would be within the order of magnitude of the capacity between the drive means and the drive plate, such measurement is too strongly disturbed.

For simple use of a resonance scanner, operation at ambient conditions is desirable. In particular, the frequency response of the resonance scanner should depend to the smallest possible extent on air pressure. A pressure housing for lowering pressure would require additional windows for the radiation to be deflected; these windows would lead to disturbing attenuations and reflections. Moreover, the construction dimensions of a resonator scanner would be strongly increased.

Thus, for ordinary applications, the space between the bottom of the stator part and the lower surface of the drive plate or of the mirror is filled with air at ambient pressure. This area, thus, provides air cushioning which has a damping effect on the movement of the drive plate and of the mirror provided as an internal oscillator. In order to eliminate said air cushioning to the greatest possible extent, the invention provides a recess in the region of the bottom of said mirror which reduces the damping of the movement of the mirror. The air cushioning is particularly reduced if the recess is provided as an opening in the bottom. In addition to the thus strongly reduced damping, the recess has the further advantage that it is not possible for the mirror to strike against the bottom during the rotary oscillation movement, because the recess is dimensioned such that a maximum mechanical deflection of the mirror is no longer limited by the bottom. During its rotary oscillation movement, the mirror can rotate into the recess.

This concept further allows to keep the distance between the drive plate and the bottom very small, without the amplitude or the frequency of the rotary oscillation to be executed by the mirror being limited by abutting against the bottom or by an air cushioning effect.

With a view to providing no mechanical stop at the bottom, it is sufficient to form the recess or the opening such that the curve of movement executable by the mirror edges does not terminate in a location at the bottom. Thus, it must be theoretically possible to rotate the mirror about 360° without touching the bottom.

With a view to reducing an air cushioning effect, the recess should still exceed this minimum. Therefore, the recess is preferably larger than the projection of the mirror located above it onto the plane of the bottom when the mirror is in its idle position. This minimizes an air cushioning effect. A recess designed in this manner enables, on the one hand, an optimum ratio of the drive torque and the damping of the drive plate, and, on the other hand, minimal damping of the mirror, without the mechanical deflection of the mirror being limited by the bottom.

However, enlargement of the recess which may be provided as an opening also reduces the surface area available for mounting the drive means, for example the maximum surface area which stator electrodes may have. Since, however, the drive torque decreases underproportionally with the reduction of the drive surface area, while damping, in particular at the desirable high frequencies, decreases overproportionally with the enlargement of the recess or opening, an improvement is nevertheless achieved by means of an enlarged recess. Therefore, it is preferred to keep the recess as large as possible, not only transversely of the axes of torsion, which is desirable with a view to reduced damping and to avoiding mechanical stopping, but to keep the recess as large as possible also in parallel with the axes of torsion. Particular preference is to be given to a recess which extends along the axis of torsion at least as far as the drive plate extends. Such recess not only reduces damping of the mirror, but advantageously also reduces damping of the drive plate. Thus, the attainable frequency range is also upwardly expanded in this regard.

If the drive plate and the drive means come into too close contact, damage may occur in some designs of the drive means. Thus, for example, voltage flashovers in electrostatic drives cause destruction of or damage to the electrodes. Also, adhesion of the drive plate to the electrode may occur, which, although it may sometimes last only a short time, changes the desired oscillation characteristics of the drive plate and, thus, also of the mirror in a disturbing way.

Since, on the other hand, in some cases a relatively high excitation of the drive means, for example high drive voltages, is required at a stator electrode, the invention advantageously provides that the drive means are formed such that no contact can occur between the drive plate and the drive means. For this purpose, suitable stops may be provided which prevent the drive plate from striking against the drive means. In the case of drive means having a very flat design, for example in stator electrodes, it is possible to use the bottom of the stator part itself as a stop by providing the drive means arranged at the bottom such that there is still a distance or a gap between the drive means and the drive plate even when the drive plate is fully deflected and contacts the bottom. For example, the drive means may be shifted toward the axis of torsion so that the gap exists even if the outer edge of the drive plate, i.e. that edge which is the most distant from the axis of torsion and performs the greatest amplitude of oscillation, contacts the bottom. A recess may also be provided in the drive means. This has the advantage that the reduction in surface area of the drive means is as small as possible.

The electrodes on the stator part are preferably formed only in a region of the drive plate which is limited, on the one hand, by the recess in the bottom of the stator part and, on the other hand, does not comprise a region wherein the drive plate may strike against the bottom upon maximum deflection. This ensures that there is definitely a gap ensuring a distance between the bottom side of the drive plate and the electrodes. Thus, no break-down can occur between the stator electrodes and the drive plate or between the mounting frame and the mirror, even if high voltages are applied. Thus, secure operation is achieved at high drive voltages.

The outer edges of the stator electrodes, i.e. those edges furthest away from the axis of torsion, are thus always at a sufficient distance from the outer edges of the drive plate and from the inner edges of the mounting frame, so that electric field peaks are reduced at these locations. Further, thermal bonding of the stator electrodes and of the drive plate upon overload becomes impossible, because they cannot contact each other anyway.

The invention will now be described by way of several examples of a resonance scanner which is manufactured using methods of semi-conductor technology. The FIGURES described hereinafter are not drawn to scale. The geometrical dimensions are within the micrometer range in the cross-sectional dimension. The size of the resonance scanner is within the centimeter range, while the size of the mirror itself is typically within the millimeter range. In the FIGURES.

Figure 1:
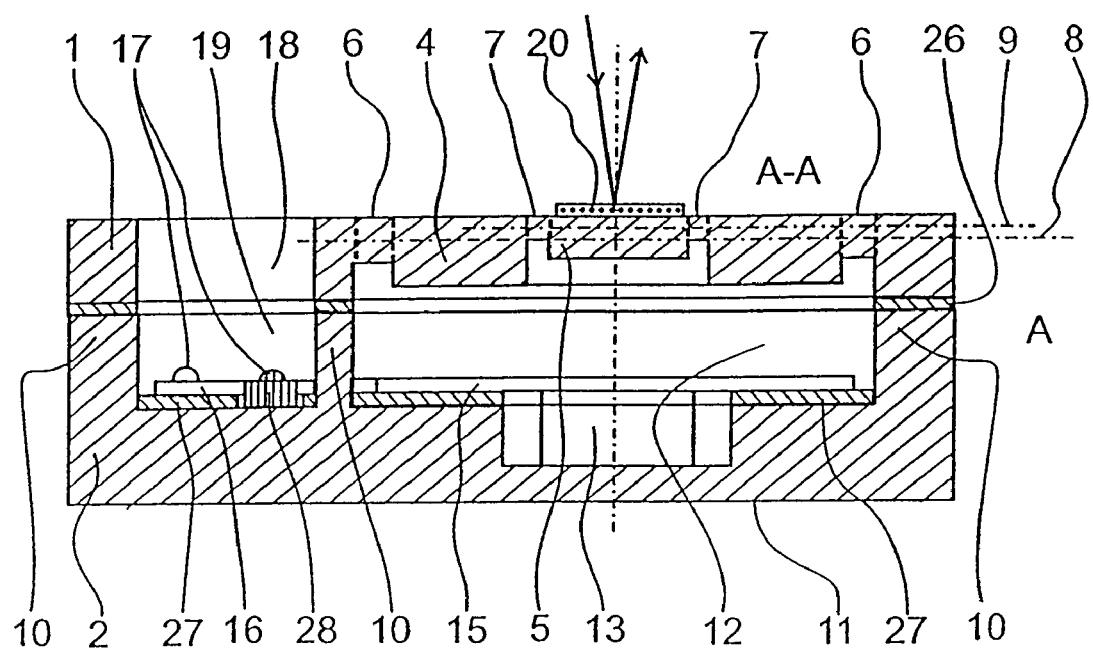
FIG. 1 is a sectional view of a resonance scanner having a cascaded electrostatic drive provided with a recess in the region of the mirror.
Figure 2:
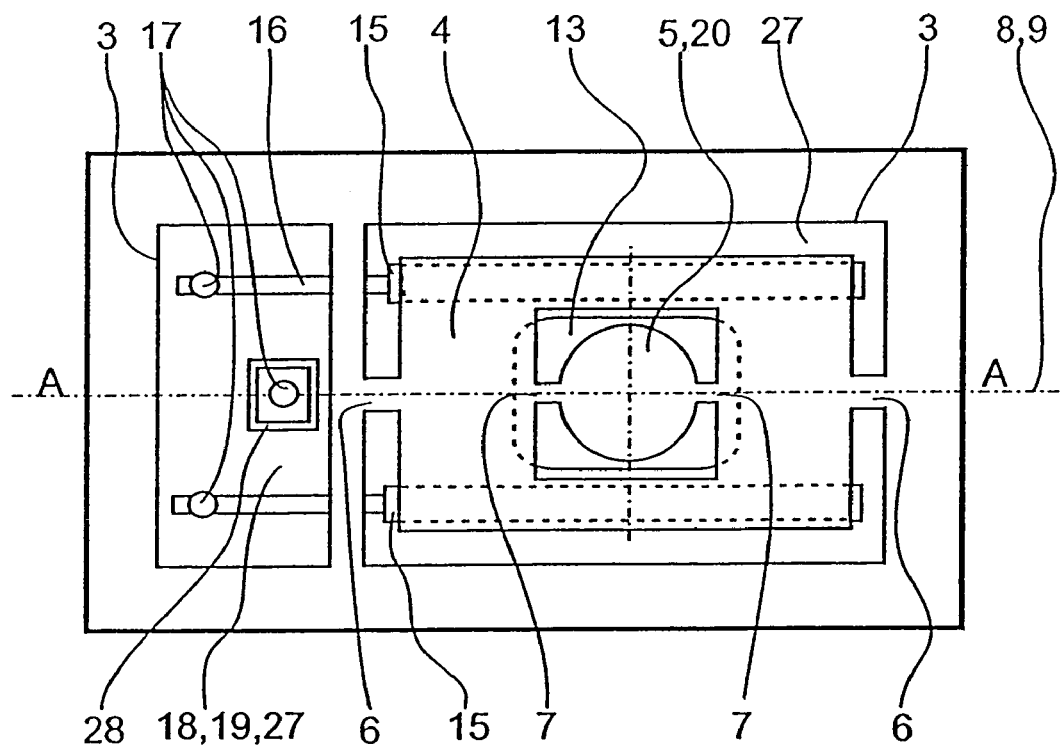
FIG. 2 is a top view of the resonance scanner of FIG. 1.
Figure 3:
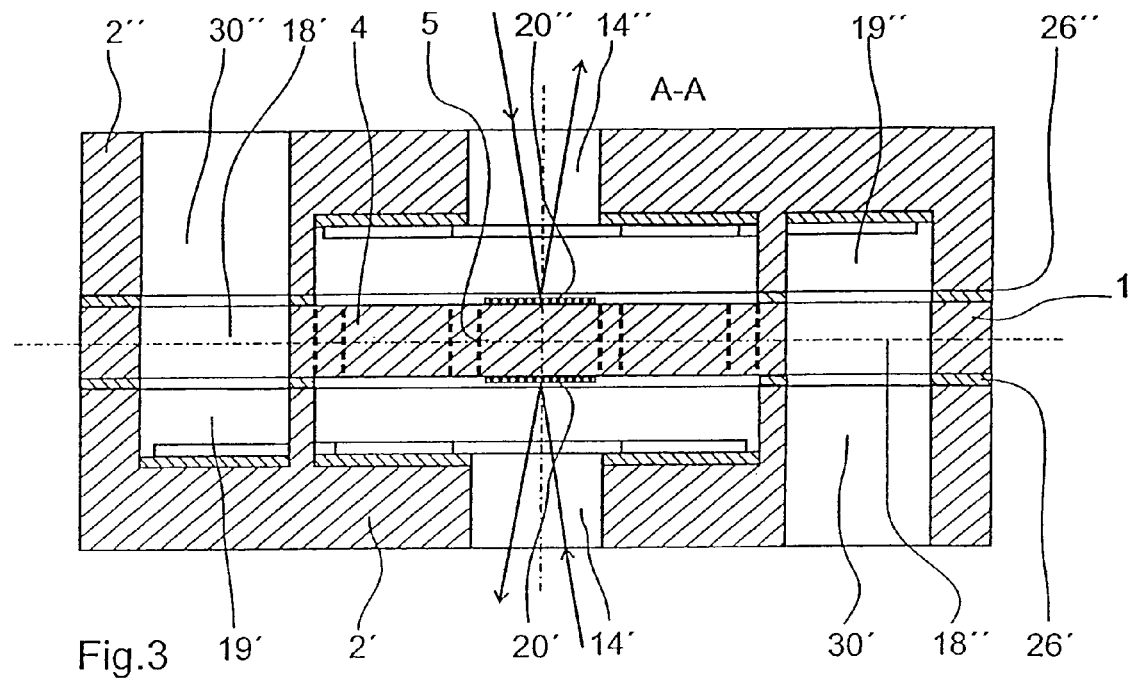
FIG. 3 is a sectional view of a resonance scanner comprising a bilateral electrostatic drive.
Figure 6:
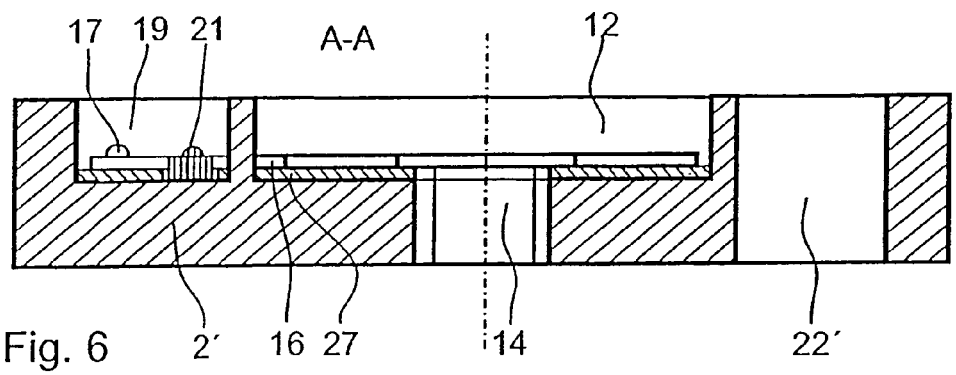
FIG. 6 is a sectional view of a stator part for the resonance scanner of FIG. 3.
Figure 9:
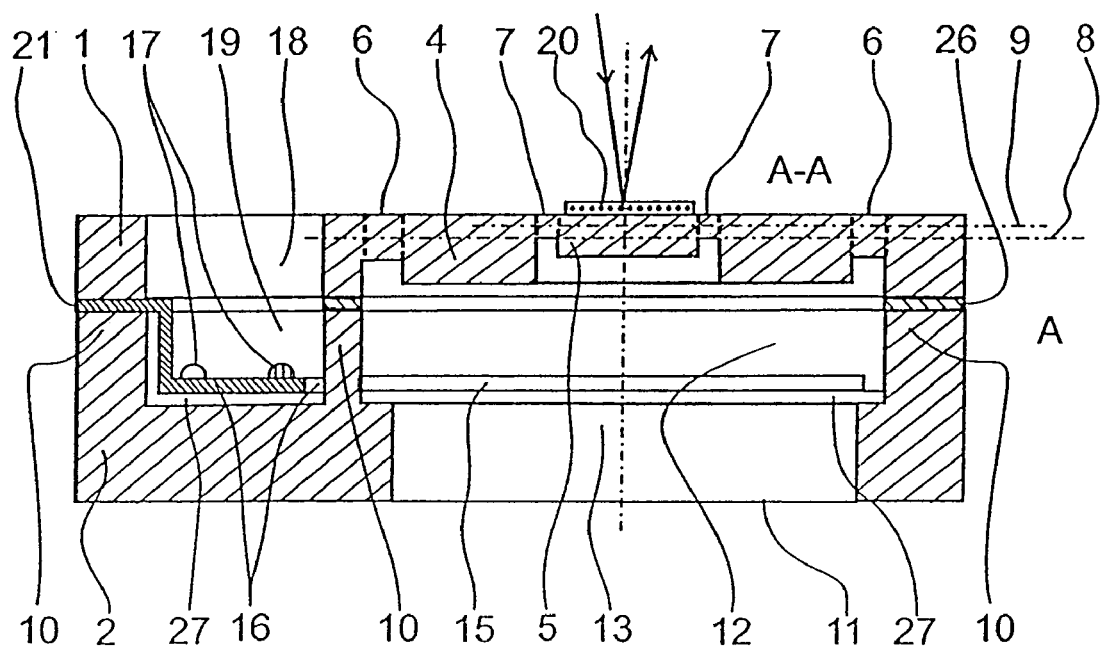
Figure 10:
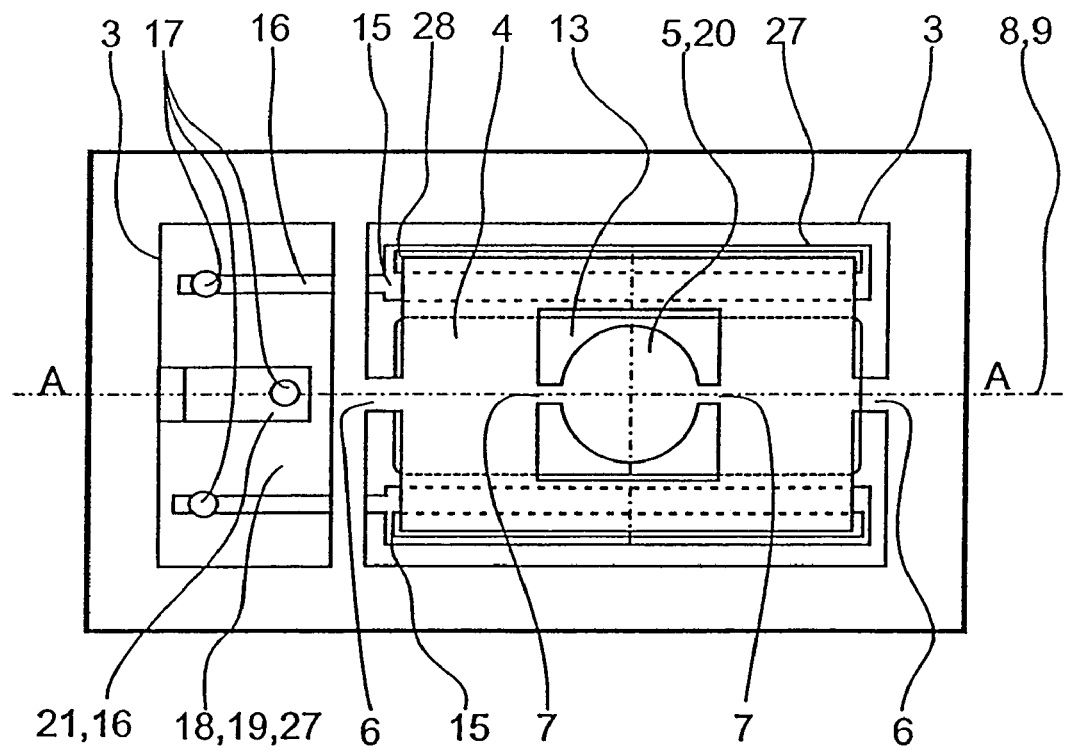
Figure 11:
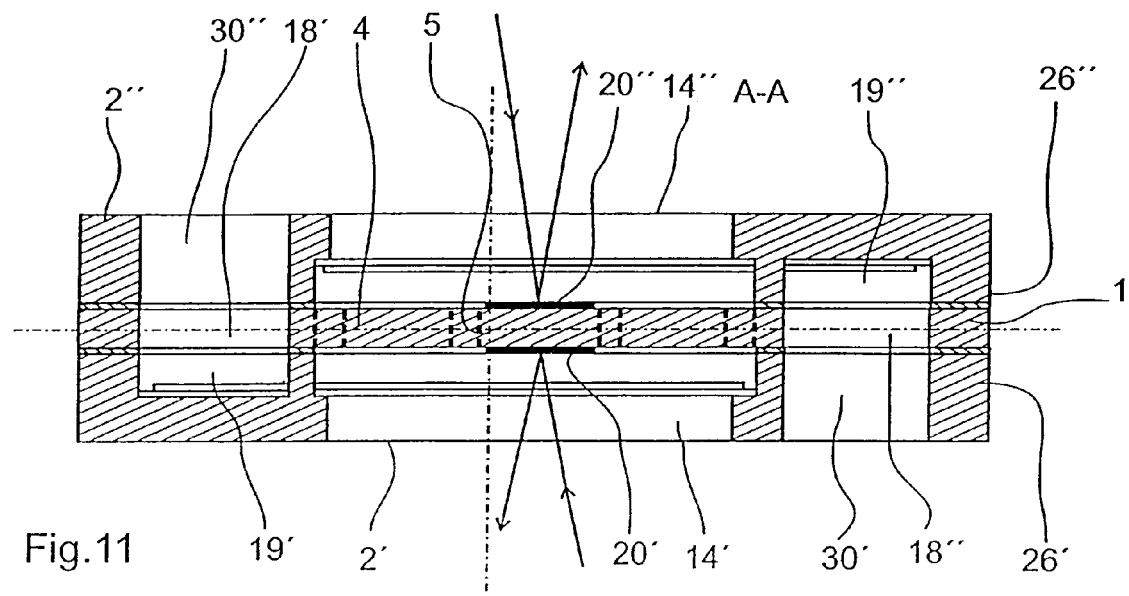
Figure 12:
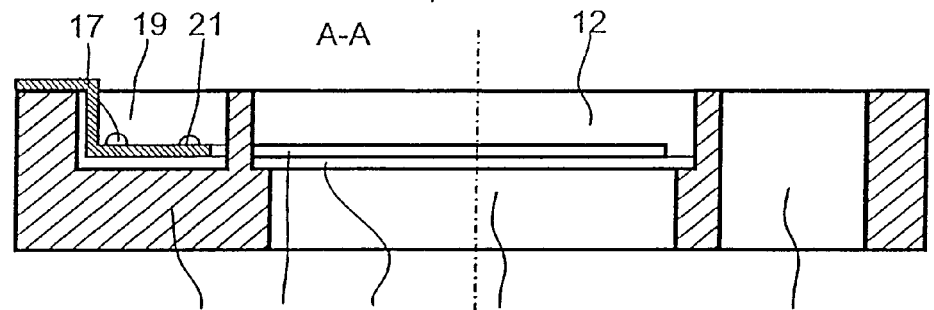
Figure 13:
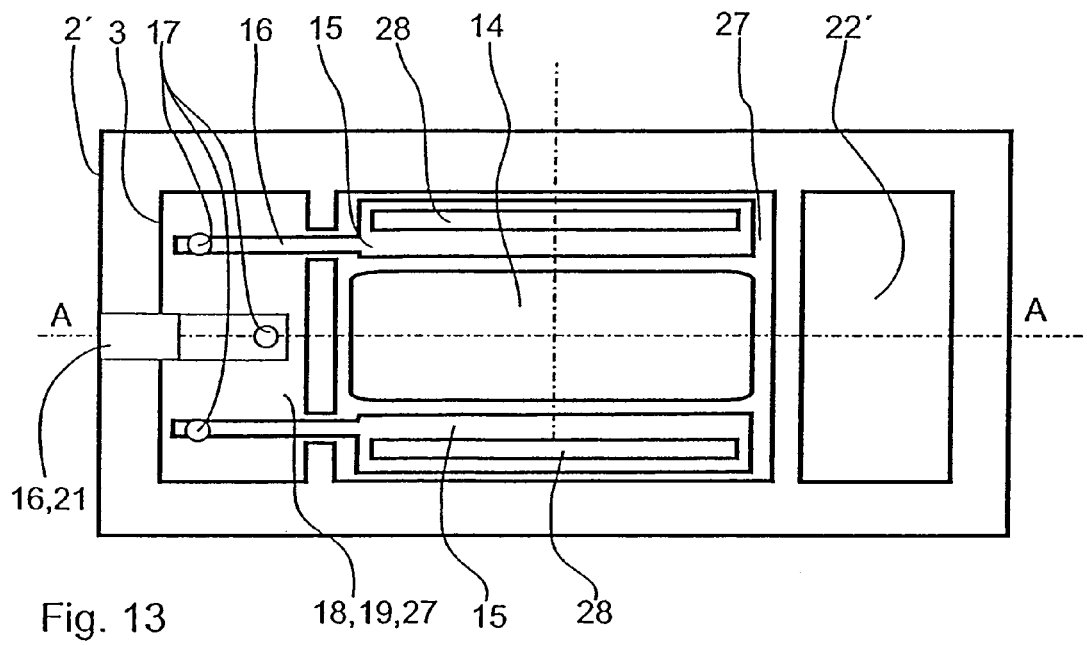

FIG. 9 shows a modified structure as compared with the resonance scanner of FIG. 1, FIG. 10 shows a view of a modified structure similar to FIG. 2, FIG. 11 shows a view of a modified structure of a resonator scanner similar to FIG. 3, FIG. 12 shows a view of a modified structure similar to FIG. 6, FIG. 13 shows a view of a modified structure similar to FIG. 7, FIG. 14 to FIG. 17 show top views of an actuator wafer and of a stator wafer during manufacture of a resonance scanner.

A resonance scanner having a cascaded drive corresponding to the views shown in FIG. 1 and FIG. 2 consists of two parts provided with layers, namely an actuator part 1 and a stator part 2, each made of monocrystalline silicon. Optionally, the stator part may also be manufactured from glass, quartz or ceramics. The actuator part 1 and the stator part 2 contain all elements of the micromechanical resonance scanner with the cascaded drive, on the one hand, in the form of the mechanical components of drive plate 4, mirror 5 with first and second torsion springs 6, 7, and, on the other hand, in the form of a drive means which, in the example, consists of stator electrodes 15, lead wires 16 and bonding pads 17. The electrostatically driven resonance scanner described herein by way of example has the advantage of large-scale parallel stator electrodes 15 while, at the same time, dispensing with a mechanical stop for the mirror 5.

The actuator part 1 is part of a structured silicon wafer having a thickness of 300 μm. Said part conveniently has a rectangular basal surface, as shown in the top view of FIG. 2. This basal surface is structured such that an internal frame 3 borders a duct 18 and also serves as a support for the oscillatory system, consisting of the first torsion springs 6, the drive plate 4, the second torsion springs 7 and the mirror 5.

The first torsion ribbons 6 connect the drive plate 4 with the frame 3 of the actuator part 1. The drive plate 4 is thereby suspended within the frame 3. The torsion ribbons 7 connect the mirror 5 with the drive plate 4.

The first torsion ribbons 6 define a first axis of torsion 8 and the second torsion ribbons 7 define a second axis of torsion 9. Thus, two parts are formed, which are per se able to oscillate independently of each other: the drive plate 4 and the mirror 5.

It is essential that the first axis of torsion 8 and the second axis of torsion 9 are arranged parallel to each other. This measure produces a strongly coupled oscillatory system comprising the oscillating parts of drive plate 4 and mirror 5. The better the coincidence between both axes of torsion 8, 9, the greater will be the degree of coupling.

FIG. 1 shows the cross-section of the resonance scanner of FIG. 2. In this example, the actuator part 1 is structured such that the drive plate 4, the first torsion springs 6, the second torsion springs 7 and the mirror 5 each have a different thickness. As a consequence, the first axis of torsion 8 and the second axis of torsion 9 are offset parallel to each other. In the example, the desired properties of the oscillating parts of the actuator part 1 in terms of dynamics of movement are achieved by dimensioning the thickness of each of said parts. The mirror 5 is 100 μm thick, the drive plate 4 is 250 μm thick. In this example, the second torsion springs 7 have a thickness of 50 μm, and the first torsion springs 6 are 70 μm thick.

The stator part 2 is part of a structured silicon or glass disk having a thickness of 525 μm and an unstructured bottom surface. As to its external dimensions, the stator part 2 is identical with the actuator part 1. Its internal dimensions correspond to those of the internal frame 3 of the actuator part 1.

The stator part 2 has a pit 19, whose position and dimension correspond to the duct 18 of the actuator part 1. The pit 19 serves to receive bonding pads 17 for the current supplies of the drive means and for connections with measuring and control means, which are not represented.

The duct 18 in the actuator part 1 ensures access for a bonding tool to produce the electrical connections.

Further, a free space 12 is provided in the stator part 2 for the space required by the drive means. The free space 12 is dimensioned such that it corresponds to the internal boundaries of the frame 3 of the actuator part 1. The side walls 10 of the stator part 2, which are formed by the free space 12 and the pit 19, serve to mount the frame 3 of the actuator part 1 with the help of a bonding layer 26. A stable unit is obtained by attaching the frame 3 to the side walls 10.

In the example, the drive means is an electrostatic drive, consisting of the two stator electrodes 15 controlled in a push-pull manner and of a counter-electrode, which, in the example, is formed by the conductive material of the drive plate 4 itself. A pole terminal 21 establishes the electrical contact. In the free space 12, the two stator electrodes 15 are arranged at the bottom, parallel and adjacent to each other, in an insulated manner, on an insulator layer 27 and are each connected with a bonding pad 17 via the lead wires 16. For an insulating basic body of the stator part, the insulating layer may also be provided as a passivation layer or may even be omitted completely.

The area of the two stator electrodes 15 extends as far as they are covered by the drive plate 4. In particular, the region below the mirror 5 is not provided with the stator electrodes 15, nor is a circumferential edge thereof nor an area below the axes of torsion 8, 9.

Further, in the region of the surface area of the mirror 5, where no stator electrodes 15 are applied, the free space 12 comprises a recess 13 which substantially enlarges the free space 12 in this region.

The recess 13 is an essential feature of the invention. This alone enables the desired, comparatively great amplitude of oscillation of the mirror 5. Through the possibility of realizing larger body distances, an air cushioning effect can be substantially reduced, which substantially improves the dynamic properties of the oscillating mirror 5.

A mirror surface 20 is applied on the mirror 5, on the surface located opposite the bottom 11.

FIG. 3 shows a cross-section of the resonance scanner having a bilateral drive. In this case, an actuator part 1 is connected with two stator parts, a lower stator part 2' and an upper stator part 2". Electric drive forces act on both surfaces of the drive plate 4.

Figure 4:
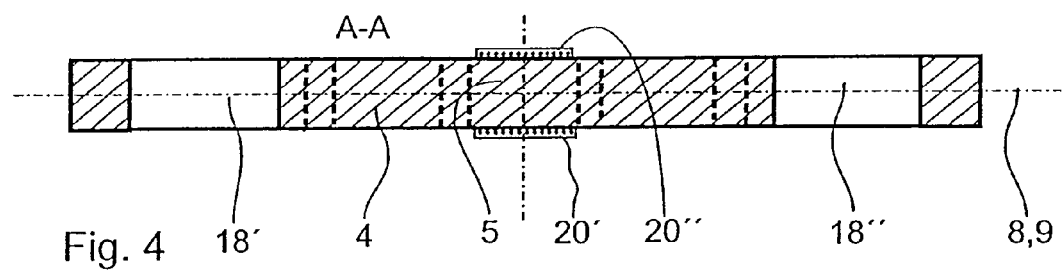
FIG. 4 is a sectional view of an actuator part for the resonance scanner of FIG. 3.
Figure 5:
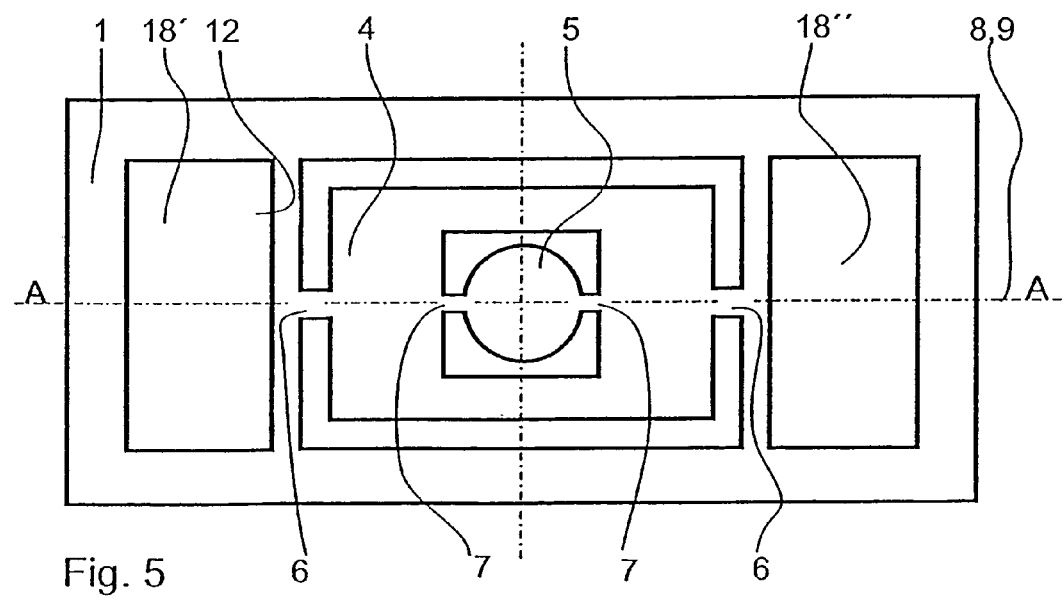
FIG. 5 is a top view of the actuator part of FIG. 4.

The actuator part 1 used here is shown in cross-section in FIG. 4 and in a top view in FIG. 5. In principle, it corresponds to the actuator part 1 with duct 18', as shown in the top view of FIG. 2, except that a further duct 18" is provided in FIG. 3 which is shown at the right-hand margin of said Figure. A further difference is that the actuator part 1 in the examples of FIG. 3 and FIG. 4 has a uniform thickness of 200 μm. The first axis of torsion 8 is identical with the second axis of torsion 9. This measure improves the stability of the coupled oscillatory system. By optimizing the geometric dimensions of the actuator part 1, structuring of the cross-section (as shown in FIG. 1) can be dispensed with, which drastically reduces the expenditure of manufacture. Further, in FIG. 3 and in FIG. 4, the mirror 5 comprises mirror surfaces 20' and 20" applied on both sides thereof.

Figure 7:
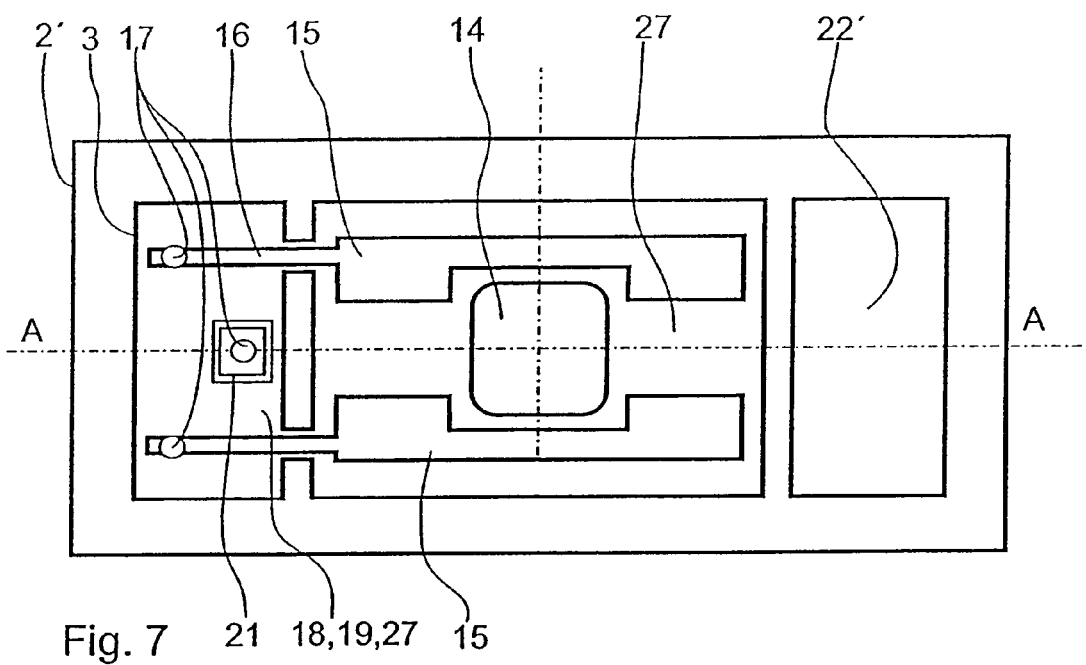
FIG. 7 is a top view of the stator part of FIG. 6.

FIG. 6 shows the cross-section of one of the stator parts, in this case the lower stator part 2', for a resonance scanner according to FIG. 3. FIG. 7 shows a top view. The lower stator part 2' corresponds to the structure as described with regard to FIG. 1 and FIG. 2. The difference consists in providing a bonding opening 30, which is shown at the right-hand margin of said FIGURES.

Further, in contrast to FIG. 1, the recess 13 in the example of FIG. 3 is provided as opening 14' in the lower stator part 2'. The upper stator part 2" has a similar opening 14". The openings 14' and 14" ensure unhindered access of optical radiation to each of the mirror layers 20' and 20". Each mirror surface 20' and 20" is used for reflection of a light bundle, for example for a useful light bundle and for a measuring light bundle. These openings 14' and 14" additionally realize the free, unhindered movement of the mirror 5 as well as the reduction of air damping.

In a design of the resonance scanner having axial symmetry, the upper stator part 2" has exactly the same structure as the lower stator part 2'. This measure reduces manufacturing expenditure. First, the actuator part 1 is connected with the lower stator part 2' via the bonding layer 26'. This compound is connected with the upper stator part 2" on the still exposed side of the actuator part 1 via the bonding layer 26". The upper stator part 2" and the lower stator part 2' are identical and are mounted on the actuator part 1 laterally inverted relative to each other. As shown in FIG. 3, two stator electrodes 15' and 15" are respectively arranged opposite one surface of the drive plate 4.

The duct 18' of the actuator part 1 is congruent with the bonding opening 22" of the upper stator part 2" and the duct 18" of the actuator part 1 is congruent with the bonding opening 22' of the lower stator part 2'. The bonding openings 22' and 22" of each of the stator parts 2' and 2" as well as the ducts 18' and 18" in the actuator part 1 ensure access of bonding tools for producing the electrical connections.

Figure 8:
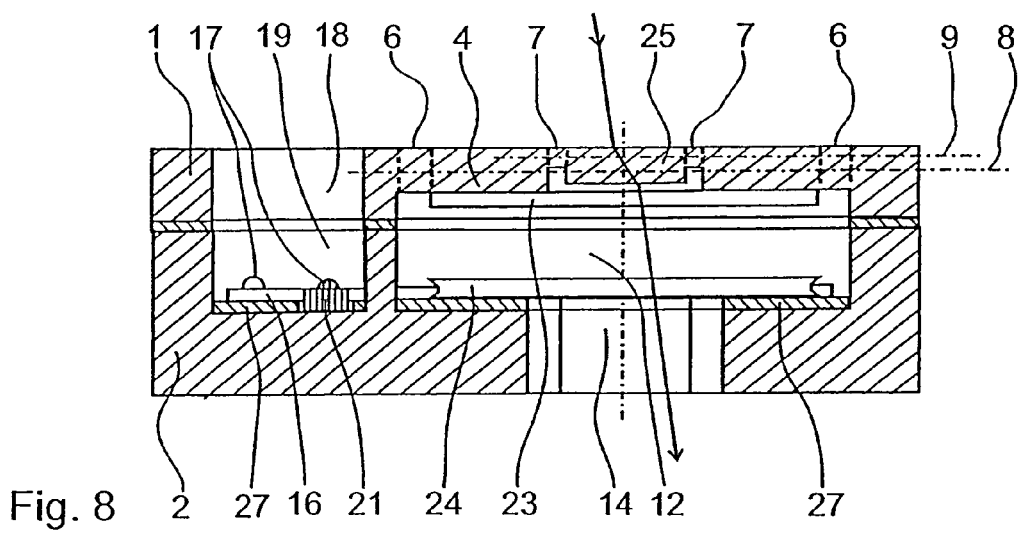
FIG. 8 is a sectional view of a resonance scanner having a cascaded electromagnetic drive and having an opening in the region of an oscillating plane parallel plate.

FIG. 8 shows the cross-section of a resonance scanner which may be structured in analogy to those described in FIGS. 1 to 7, except that, in this case, the drive means is realized as an electromagnetic drive. On its side facing the stator part 2, the actuator part 1 carries a hard permanent magnet layer 23. In the stator part 2, two electric circuits are provided in the region of the free space 12 on the isolator layer 27, of which the coil 24, which is only schematically represented, is a flat coil which generates alternating electromagnetic forces. The electric circuits of two flat coils are arranged at a distance from each other and symmetrically on both sides of the axes of torsion 8, 9, in analogy to the stator electrodes 15 of FIG. 2 or 7. The bonding of the coils 24 is effected via the lead wires 16. The element of the mirror 5 previously referred to as actuator part 1 is, in this case, provided as a plane-parallel optical plate 25. In this case, the stator part 2 has the opening 14 in its bottom surface, so as to ensure free beam passage, for example, in the case of silicon, in the infrared spectral range. The plane-parallel optical plate 25 is, in this case, only a further example of a beam-influencing optical element. Further, use can be made of lenses, curved mirrors, optical gratings or Fresnel structures as oscillating mirror 5.

FIG. 9 shows a sectional view of a resonator scanner similar to FIG. 1. One difference consists in that, in this case, the stator part 10 is made of glass, for which reason the layer 27 is a passivation layer applied for better adhesion of the stator electrodes 15 as well as of the lead wires 16. A further difference between the resonator scanner shown in FIG. 9 and the one shown in FIG. 1 is that the recess is now in the form of an opening 13 which also extends over a larger area. Apart from that, the resonance scanner of FIG. 9 corresponds to that of FIG. 1.

The size of the opening 13 is clearly recognizable in FIG. 10 which, like FIG. 2, shows a top view. Viewed in a projection onto the plane of the bottom 11, the opening 13 is wider than the mirror 5, transversely of the axes of torsion. In the direction of the axes of torsion, the opening 13 extends beyond the edge of the drive plate 4 projected onto the bottom 11.

FIG. 11 shows a sectional view of a bilaterally actuated resonance scanner which essentially corresponds to the resonance scanner shown in FIG. 3, except that the openings 14' and 14", as mentioned above, are larger. Through said larger openings, light rays reflected by the mirror surfaces 20' and 20" can be incident also at considerably more oblique angles than in the structure of FIG. 3.

FIG. 12 shows a sectional view of one of the stator parts, in this case the lower stator part 2' of the resonance scanner of FIG. 11, and corresponds essentially to the representation of FIG. 6, again with the difference that the opening 14 is larger. In this case, the stator part 2' is also made of glass; therefore, the insulating layer is replaced by an adhesive layer or passivation layer 27.

FIG. 13 shows the corresponding top view of the stator part, wherein the enlarged opening 14 is clearly recognizable. As an additional modification of the stator part shown in FIG. 7, the electrodes 15 comprise recesses 28, which are rectangular in the present example. Said recesses 28 are formed in those regions where the drive plate 4, when fully deflected, contacts the bottom 11. The recesses 28 ensure that the electrodes 15 cannot contact the drive plate 4 even if the drive plate 4 is fully deflected. The dimensioning of the recess 28 is selected so as to ensure that there is always a sufficient distance or gap between the electrode 15 and the drive plate 4 to make a voltage break-down or adhesion of the drive plate 4 to the electrode 15 impossible.

In the following, a process for manufacturing the actuator part and the stator part as well as their assembly to form the resonant mirror are described by way of example.

Figure 14:
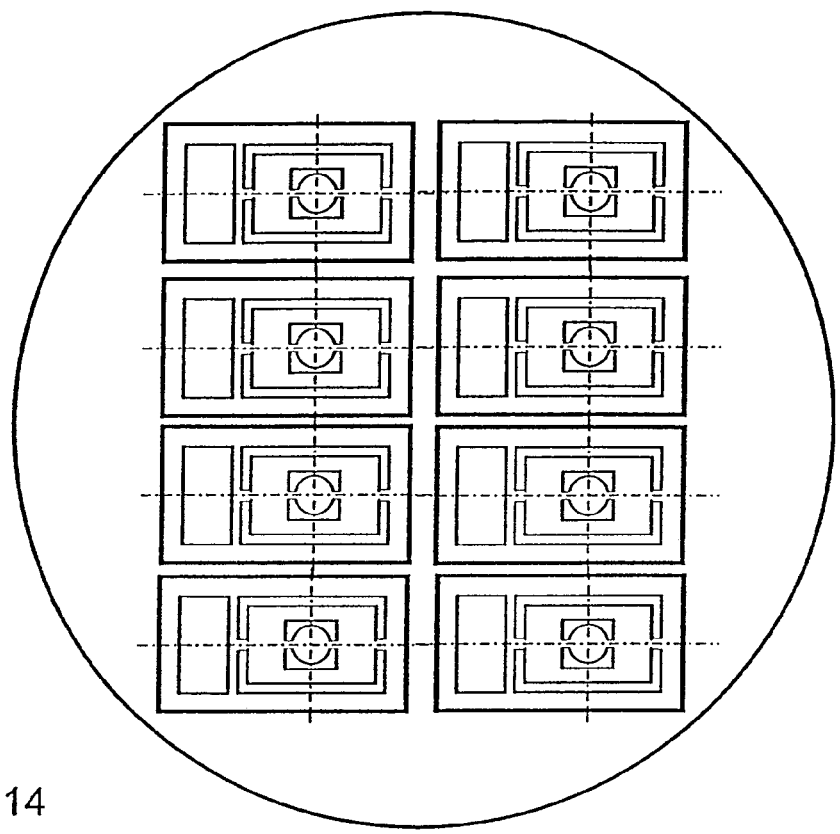

The starting material for the simultaneous manufacture of a large number of identical actuator parts 1 is a double-sided, polished silicon wafer having a thickness of 200 μm, referred to below as actuator wafer. Said actuator wafer is coated with a first aluminum layer on its front face and with a second aluminium layer on its reverse face. Deposition is conventionally effected by magnetron sputtering. Next, the aluminium layer on the front face of the actuator wafer is structured with the help of a lacquer layer. Said structuring is preferably effected by plasma etching. In a dry etching step that follows then, the structured aluminum layer serves as a mask. The drive plate 4 comprising the first torsion springs 6, as well as the mirror 5 comprising the torsion springs 7 are formed in this step. The result of this step of the manufacturing method is represented in FIG. 14 which shows a top view of an actuator wafer. The frame 3, wherein the torsion springs 6 are suspended with the drive plate 4, ensures that the internal tension of the material, in particular in the region of the torsion springs 6, remains unchanged.

Next, the aluminum layer is removed by a wet-chemical etching method, and the mirror layer 20 is deposited on the front face of the mirror 5. The material of the mirror layer 20 is selected according to the wavelength to be reflected. Said material is usually aluminum or a sandwich of chromium and gold or silver with corresponding protective layers.

The starting material for the simultaneous manufacture of a great number of identical stator parts 2, 2' and 2" is a double-sided, polished silicon wafer having a thickness of 525 μm, referred to below as stator wafer. Said stator wafer is thermally oxidized and provided with a nitride layer on both sides. The oxide layers and the nitride layers of the stator wafer are structured with the help of photolithographic processes and plasma-etching steps.

The layout of the recess 13 or of the opening 14, the free space 12 and, further, the pit 19 and the bonding opening 22 are produced in a defined manner. If glass is used for the stator wafer, photolithography with plasma etching may be directly employed.

Figure 15:
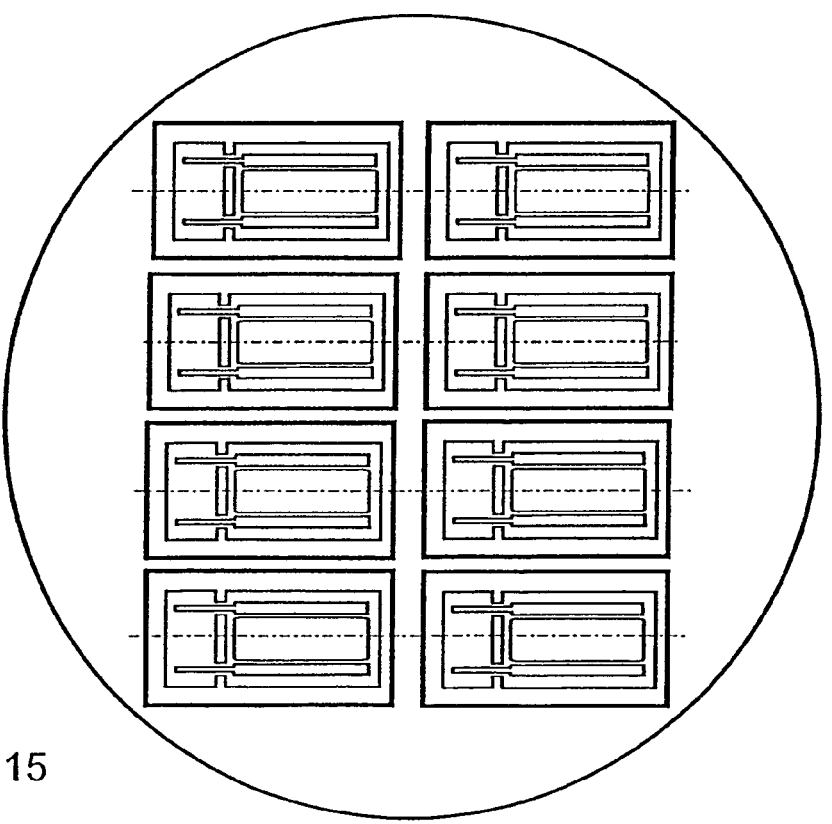
Figure 16:
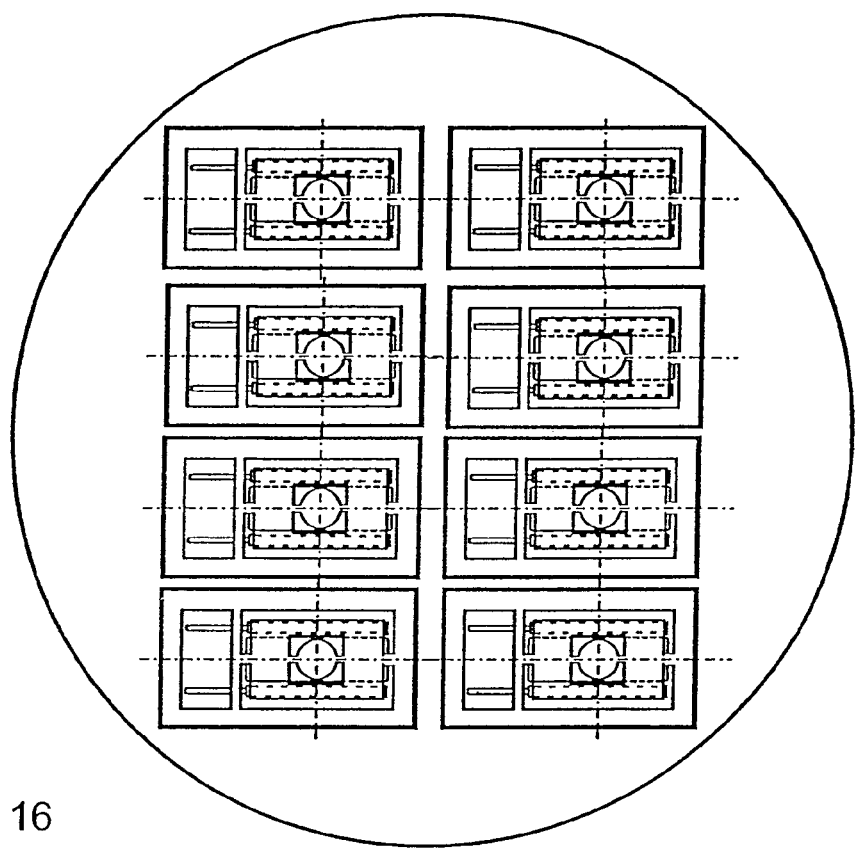
Figure 17:
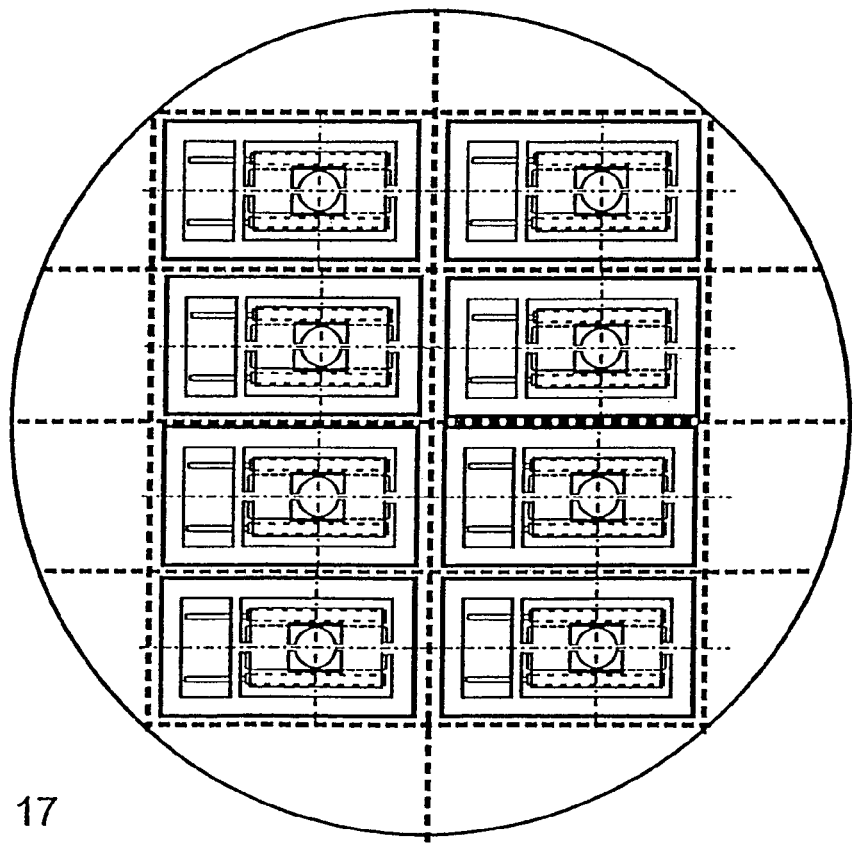

Upon removal of all masking layers, an insulating layer 27 is applied in the pit 19 and on the basal surface of the free space 12. A metallization layer is then deposited thereon and structured so as to form the stator electrodes 15, the lead wires 16, the bonding pads 17 and the pole terminal 21. This condition is shown in FIG. 15 in a top view of the stator wafer.

In the case of the electromagnetic drive, the coils 24 are fixed within the free space 12 together with the stator part 2. The coil 24 is conveniently applied to the basal surface of the free space 12 as a flat coil in order to realize a small constructional height. The coil 24 can also be a coil 24 comprising windings of wire, which coil is then conveniently fixed to the stator part 2 and protrudes into the free space 12 with its pole terminal.

The actuator wafer 1 is bonded to the stator wafer 2 or 2' by means of a low-temperature bonding method. In the case of a glass wafer, anodic bonding or gluing may be used; for ceramics, gluing is possible. The result thereof is shown as a top view in FIG. 16.

In the case of the bilateral drive, the resulting compound is then bonded to the further, upper stator wafer 2" by a low-temperature bonding method. The compound is separated by separation sawing. The saw lines are indicated in broken lines in FIG. 15. This results in a multiplicity of ready-to-use resonant mirrors.

What is claimed is:

1. A resonance scanner, comprising:
    an actuator,
        wherein the actuator further comprises a fixture, wherein a drive plate is operably coupled to the fixture by first torsion springs such that the drive plate operably oscillates about a common first axis of torsion of the first torsion springs and has a first eigenfrequency,
        wherein a mirror is operably coupled within and to the drive plate by second torsion springs such that the mirror operably oscillates about a common second axis of torsion of the second torsion springs and has a second eigenfrequency that is different from the first eigenfrequency, wherein the first axis of torsion and the second axis of torsion are substantially parallel; and a stator,
    wherein the stator comprises a driver operably arranged in an area defined by the drive plate, wherein the driver is operably controllable to allow direct application of force to the drive plate, wherein the applied force has a period tuned to the second eigenfrequency,
    wherein the stator further comprises a plurality of side walls and a bottom, and wherein the fixture comprises a frame operably coupled to the plurality of side walls,
    wherein the driver is operably coupled to the bottom of the stator, and
    wherein the bottom further comprises a recess operable to reduce damping of the mirror, the recess disposed to operably allow a maximum mechanical deflection of the mirror.

2. The resonance scanner of claim 1, wherein the driver operably generates an electrostatic force, and wherein the driver is operably coupled to the stator and is in operable communication with a bottom surface of the drive plate.

3. The resonance scanner of claim 1, wherein the stator is operably coupled to the frame of the actuator on at least two opposing sides of the mirror.

4. The resonance scanner of claim 1, wherein the actuator further comprises a torsion-resistant resilient material.

5. The resonance scanner of claim 1, wherein the mirror further comprises an optically active surface having a reflective layer.

6. The resonance scanner of claim 5, wherein a first and a second optically active surface of the mirror are disposed opposite each other in parallel, wherein the first and the second optically active surfaces operably reflect at least a first electromagnetic wavelength, and wherein the first optically active surface operably reflects a useful beam and the second optically active surface operably reflects a measuring beam.

7. The resonance scanner of claim 6, wherein the mirror is transparent for at least a second electromagnetic wavelength.

8. The resonance scanner of claim 6, wherein at least one of the first and second optically active surfaces of the mirror is curved.

9. The resonance scanner of claim 1, wherein the bottom of the stator comprises at least one opening exposing a region of the mirror.

10. The resonance scanner of claim 1, wherein the stator further comprises a body, and wherein the body comprises an electrically insulating material.

11. The resonance scanner of claim 10, wherein the electrically insulating material is selected from the group consisting of glass, ceramic and quartz.

12. The resonance scanner of claim 1, wherein the recess is larger than a projection of the mirror onto the bottom of the stator.

13. The resonance scanner of claim 1, wherein the driver further comprise at least one electrode disposed on the bottom of the stator, at least one lead wire, and at least one bonding pad, wherein the electrodes are disposed such that there is a gap between the drive plate and the at least one electrode when the drive plate is fully deflected and arranged at the bottom of the stator.

14. A resonance scanner, comprising:
an actuator, the actuator comprising a frame and an oscillatory assembly; and
a stator, the stator comprising a plurality of side walls, a bottom surface, and a drive assembly;
wherein the oscillatory assembly further comprises a drive plate operably coupled to the frame by a first set of springs that define a first axis of torsion and have a first eigenfrequency, and a mirror operably coupled to the drive plate by a second set of springs that define a second axis of torsion and have a second eigenfrequeney, wherein the first and second axis of torsion are substantially parallel, wherein the drive assembly is coupled to the bottom surface of the stator and disposed in an area defined by the drive plate and is in operable communication with the drive plate to apply a direct force to the drive plate, wherein the applied direct force has a period tuned to the second eigenfrequency, and wherein the bottom surface of the stator further comprises a recess aligned with the mirror.

15. The resonance scanner of claim 14, wherein the drive assembly further comprises at least one electrode, at least one lead wire, and at least one bonding pad in operable communication with the stator and a bottom surface of the drive plate.

16. The resonance scanner of claim 14, wherein the stator is operably coupled to the frame of the actuator on at least two opposing sides of the mirror.

17. The resonance scanner of claim 14, wherein the force comprises an electrostatic force.

18. The resonance scanner of claim 14, wherein the force comprises an electromagnetic force.

19. The resonance scanner of claim 14, wherein the mirror further comprises a first and a second optically active surface each having a reflective layer and disposed opposite each other in parallel, wherein the first and second optically active surfaces operably reflect at least a first electromagnetic wavelength, and wherein the first optically active surface operably reflects a useful beam and the second optically active surface operably reflects a measuring beam.

20. The resonance scanner of claim 19, wherein at least one of the first and second optically active surfaces of the mirror is curved.

21. The resonance scanner of claim 14, wherein the bottom surface of the stator comprises at least one opening exposing a region of the mirror.

22. The resonance scanner of claim 14, wherein the recess is larger than a projection of the mirror onto the bottom surface of the stator.

23. The resonance scanner of claim 14, wherein the drive assembly further comprises at least one electrode disposed on the bottom surface of the stator, the electrodes disposed such that there is a gap between the drive plate and the at least one electrode when the drive plate is fully deflected and arranged at the bottom of the stator.

* * * * *